US012648123B2

(12) United States Patent　(10) Patent No.: US 12,648,123 B2
Yamashita et al.　(45) Date of Patent:　Jun. 2, 2026

(54) MANAGEMENT DEVICE AND MANAGEMENT METHOD, AND WORK DEVICE

(71) Applicant: FUJI CORPORATION, Chiryu (JP)

(72) Inventors: Yukihiro Yamashita, Toyohashi (JP); Fumiya Mizutani, Toyota (JP); Taehune Kim, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 369 days.

(21) Appl. No.: 18/251,317

(22) PCT Filed: Nov. 10, 2020

(86) PCT No.: PCT/JP2020/041944
§ 371 (c)(1),
(2) Date: May 1, 2023

(87) PCT Pub. No.: WO2022/101991
PCT Pub. Date: May 19, 2022

(65) Prior Publication Data
US 2023/0413501 A1　Dec. 21, 2023

(51) Int. Cl.
H05K 13/02　(2006.01)
H05K 13/08　(2006.01)

(52) U.S. Cl.
CPC ......... H05K 13/021 (2013.01); H05K 13/086 (2018.08)

(58) Field of Classification Search
CPC ........................... H05K 13/021; H05K 13/086
See application file for complete search history.

(56) References Cited

U.S. PATENT DOCUMENTS

| 10,285,314 | B2 * | 5/2019 | Nishiyama | ......... H05K 13/0413 |
| 10,820,459 | B2 * | 10/2020 | Kondo | .................. H05K 13/08 |
| 11,864,324 | B2 * | 1/2024 | Yasui | .................. H05K 13/085 |
| 2021/0307224 | A1 * | 9/2021 | Yasui | .................. H05K 13/086 |
| 2022/0110233 | A1 * | 4/2022 | Yamashita | ........... H05K 13/085 |

(Continued)

FOREIGN PATENT DOCUMENTS

| JP | 2011-91350 A | 5/2011 | |
| WO | WO-2017033268 A1 * | 3/2017 | ........... H05K 13/021 |

(Continued)

OTHER PUBLICATIONS

International Search Report issued Jan. 12, 2021 in PCT/JP2020/041944 filed on Nov. 10, 2020, 2 pages.

*Primary Examiner* — Gerald McClain
(74) *Attorney, Agent, or Firm* — Oblon, McClelland, Maier & Neustadt, L.L.P.

(57)　ABSTRACT

A management device is for use in a component mounting system including a component mounting machine having a supply target attachment section and a buffer target attachment section. In a case where a target feeder to be used in a target job to be executed from the next time are pre-served on the component mounting machine, the management device is configured to determine a serving destination among empty slots in a supply target attachment section and empty slots in a buffer target attachment section by giving priority to the empty slots in the buffer target attachment section, and cause a work device to pre-serves the target feeder in the determined serving destination.

6 Claims, 7 Drawing Sheets

(56)            References Cited

U.S. PATENT DOCUMENTS

2023/0371224 A1 *  11/2023  Yamashita ........... H05K 13/086
2023/0389251 A1 *  11/2023  Sanji .................. H05K 13/0812
2023/0413501 A1 *  12/2023  Yamashita ........... H05K 13/021
2023/0415998 A1 *  12/2023  Fujii ................... B65G 1/1375

FOREIGN PATENT DOCUMENTS

WO      WO 2020/039544  A1      2/2020
WO      WO 2020/157856  A1      8/2020

* cited by examiner

Fig. 6

| POSITION INFORMATION | | FEEDER INFORMATION | | |
|---|---|---|---|---|
| LOCATION | SLOT | FEEDER ID | COMPONENT TYPE | NUMBER OF REMAINING COMPONENTS |
| FEEDER STORAGE | #1 | *** | *** | *** |
| | #2 | *** | *** | *** |
| | #3 | *** | *** | *** |
| | ⋮ | ⋮ | ⋮ | ⋮ |
| MOUNTING MACHINE 1 SUPPLY AREA | #1 | *** | *** | *** |
| | #2 | *** | *** | *** |
| | #3 | *** | *** | *** |
| | ⋮ | ⋮ | ⋮ | ⋮ |
| MOUNTING MACHINE 1 BUFFER AREA | #1 | *** | *** | *** |
| | #2 | *** | *** | *** |
| | #3 | *** | *** | *** |
| | ⋮ | ⋮ | ⋮ | ⋮ |

Fig. 7

| ORDER OF PRODUCTION | COMPONENT ARRANGEMENT INFORMATION | | | | | |
|---|---|---|---|---|---|---|
| | #1 | #2 | #3 | #4 | #5 | #6 |
| JOB 1 | *** | *** | *** | *** | *** | *** |
| JOB 2 | *** | *** | *** | *** | *** | *** |
| JOB 3 | *** | *** | *** | *** | *** | *** |

Fig. 8

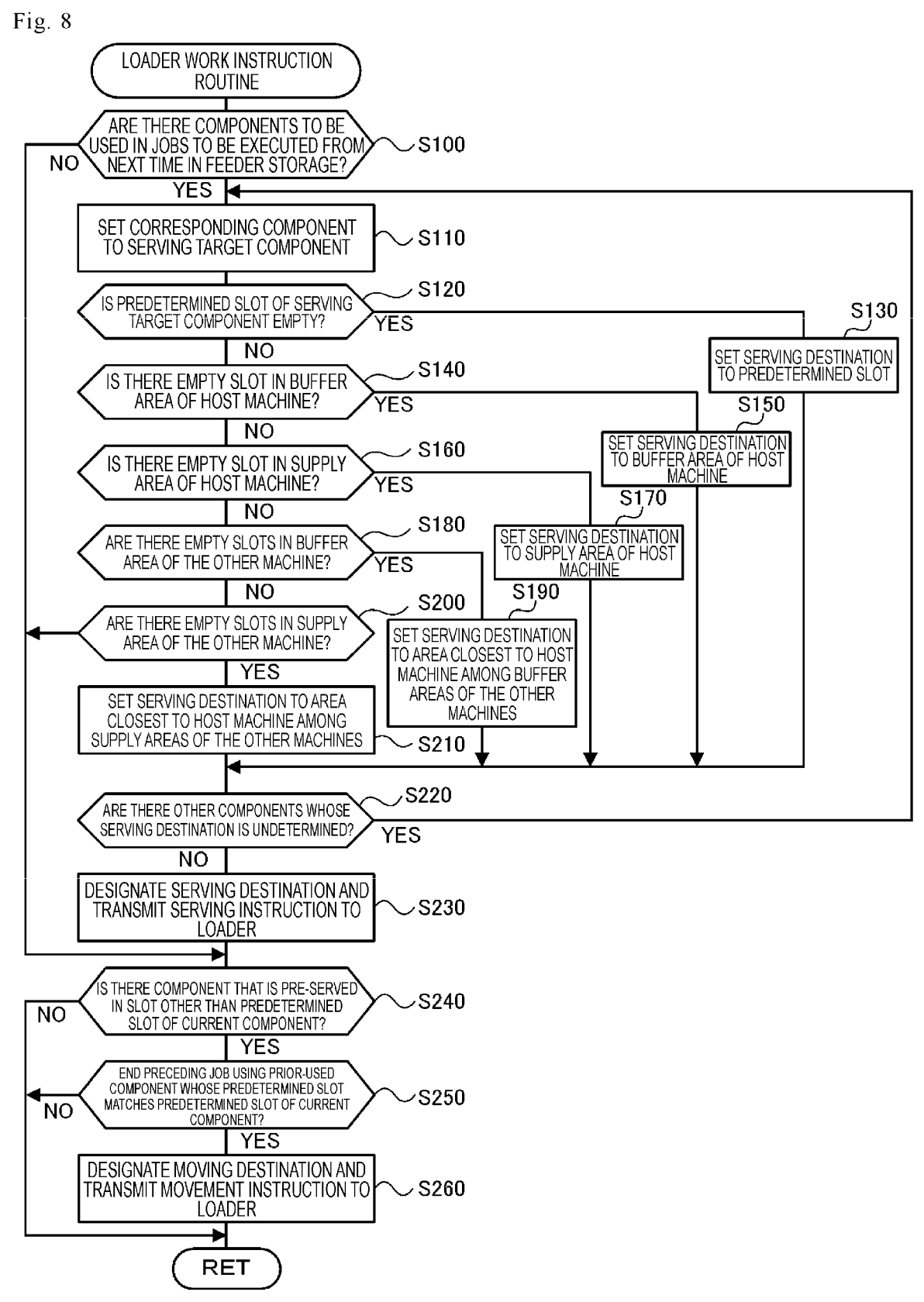

```
                    ┌────────────────────────────┐
                    │  LOADER WORK INSTRUCTION   │
                    │         ROUTINE            │
                    └────────────────────────────┘
                                 │
         ┌───────────────────────────────────────┐
         │  ARE THERE COMPONENTS TO BE           │ ⌐ S100
    ◄────│  USED IN JOBS TO BE EXECUTED FROM     │
    NO   │  NEXT TIME IN FEEDER STORAGE?         │
         └───────────────────────────────────────┘
                        │ YES
         ┌───────────────────────────────┐
         │  SET CORRESPONDING COMPONENT  │ ⌐ S110
         │   TO SERVING TARGET COMPONENT │
         └───────────────────────────────┘
                        │                                                S130
         ┌───────────────────────────┐ ⌐ S120                    ┌──────────────────────┐
         │ IS PREDETERMINED SLOT OF  │────────────────────────►│ SET SERVING DESTINATION│
         │ SERVING TARGET COMPONENT  │ YES                      │  TO PREDETERMINED SLOT │
         │ EMPTY?                    │                          └──────────────────────┘
         └───────────────────────────┘                              S150
                        │ NO
         ┌───────────────────────────┐ ⌐ S140                ┌──────────────────────┐
         │ IS THERE EMPTY SLOT IN    │─────────────────────►│ SET SERVING DESTINATION│
         │ BUFFER AREA OF HOST       │ YES                   │ TO BUFFER AREA OF HOST │
         │ MACHINE?                  │                       │       MACHINE          │
         └───────────────────────────┘                       └──────────────────────┘
                        │ NO                                    S170
         ┌───────────────────────────┐ ⌐ S160            ┌──────────────────────┐
         │ IS THERE EMPTY SLOT IN    │─────────────────►│ SET SERVING DESTINATION│
         │ SUPPLY AREA OF HOST       │ YES               │ TO SUPPLY AREA OF HOST │
         │ MACHINE?                  │                   │       MACHINE          │
         └───────────────────────────┘                   └──────────────────────┘
                        │ NO                          S190
         ┌───────────────────────────┐ ⌐ S180       ┌──────────────────────┐
         │ ARE THERE EMPTY SLOTS IN  │────────────►│ SET SERVING DESTINATION│
         │ BUFFER AREA OF THE OTHER  │ YES          │ TO AREA CLOSEST TO HOST│
         │ MACHINE?                  │              │ MACHINE AMONG BUFFER   │
         └───────────────────────────┘              │ AREAS OF THE OTHER     │
                        │ NO          S200           │ MACHINES               │
         ┌───────────────────────────┐              └──────────────────────┘
    ◄────│ ARE THERE EMPTY SLOTS IN  │
         │ SUPPLY AREA OF THE OTHER  │
         │ MACHINE?                  │
         └───────────────────────────┘
                        │ YES
         ┌───────────────────────────────┐
         │ SET SERVING DESTINATION TO    │
         │ AREA CLOSEST TO HOST MACHINE  │
         │ AMONG SUPPLY AREAS OF THE     │
         │ OTHER MACHINES                │ ⌐ S210
         └───────────────────────────────┘
                        │
         ┌───────────────────────────────┐ ⌐ S220
         │ ARE THERE OTHER COMPONENTS    │──── YES
         │ WHOSE SERVING DESTINATION IS  │
         │ UNDETERMINED?                 │
         └───────────────────────────────┘
                        │ NO
         ┌───────────────────────────────┐
         │ DESIGNATE SERVING DESTINATION │ ⌐ S230
         │ AND TRANSMIT SERVING          │
         │ INSTRUCTION TO LOADER         │
         └───────────────────────────────┘
                        │
         ┌───────────────────────────────┐ ⌐ S240
    ◄────│ IS THERE COMPONENT THAT IS    │
    NO   │ PRE-SERVED IN SLOT OTHER THAN │
         │ PREDETERMINED SLOT OF CURRENT │
         │ COMPONENT?                    │
         └───────────────────────────────┘
                        │ YES
         ┌───────────────────────────────┐ ⌐ S250
    ◄────│ END PRECEDING JOB USING       │
    NO   │ PRIOR-USED COMPONENT WHOSE    │
         │ PREDETERMINED SLOT MATCHES    │
         │ PREDETERMINED SLOT OF CURRENT │
         │ COMPONENT?                    │
         └───────────────────────────────┘
                        │ YES
         ┌───────────────────────────────┐
         │ DESIGNATE MOVING DESTINATION  │ ⌐ S260
         │ AND TRANSMIT MOVEMENT         │
         │ INSTRUCTION TO LOADER         │
         └───────────────────────────────┘
                        │
                    ┌────────┐
                    │  RET   │
                    └────────┘
```

MANAGEMENT DEVICE AND MANAGEMENT METHOD, AND WORK DEVICE

TECHNICAL FIELD

The present specification discloses a management device, a management method, and a work device for use in a component mounting system.

BACKGROUND ART

Conventionally, a mounting system is proposed that includes a component mounting machine including multiple mounting target attachment sections (slots) to which a feeder is attached and a mounting section that picks up and mounts a component from the feeder attached to the mounting target attachment section, and a mobile work device that performs collecting the feeder from the mounting target attachment section and serving the feeder to the mounting target attachment section (refer to Patent Literature 1, for example). The component mounting machine further includes a buffer target attachment section for temporarily storing the feeder. The mobile work device pre-serves the feeder to be used for sequent production in an empty mounting target attachment section and an empty buffer target attachment section.

PATENT LITERATURE

Patent Literature 1: International Publication WO2020/039544

Brief Summary

Technical Problem

In a case where a feeder is pre-served in an empty mounting target attachment section, the pre-serving is not necessarily performed in the order of the earlier order of use. For example, when component shortage is predicted in some feeders during the production, in order to avoid suspension of production as much as possible, there is a case where a spare feeder accommodating the same type of component is set on the empty mounting target attachment section (empty slot). In this case, when a large number of feeders to be used for the subsequent production are attached on the mounting target attachment section, and thus there is no empty slot in the mounting target attachment section, the mobile work device needs to detach the feeder that is not used in the current production from the mounting target attachment section once, and then, attach the spare feeder that is to be used in the current production. Therefore, in the conventional method, it takes time to perform serving work, and there is a case where the serving of the feeder is not efficient.

It is an object of the present disclosure to perform serving of a feeder more efficiently.

Solution to Problem

The present disclosure employs the following means in order to achieve the above-described main object.

The management device of the present disclosure is a management device for use in a component mounting system including
a component mounting machine that includes a supply target attachment section having multiple slots to which a feeder is attached, a buffer target attachment section having multiple slots to which the feeder is attached, and a mounting section that executes a mounting job of picking up and mounting a component supplied from a feeder attached in a slot in the supply target attachment section, and a work device configured to perform serving work and collecting work of the feeder for each slot in the supply target attachment section and each slot in the buffer target attachment section, the management device including:

a management control section configured to, in a case where a target feeder to be used in a target job to be executed from the next time is pre-served in the component mounting machine, determine a serving destination among empty slots in the supply target attachment section and empty slots in the buffer target attachment section by giving priority to the empty slots in the buffer target attachment section, and cause the work device to pre-serve the target feeder in the determined serving destination.

The management device of the present disclosure is for use in the component mounting system including the component mounting machine that includes the supply target attachment section and the buffer target attachment section. In a case where the target feeder to be used in the target job to be executed from the next time is pre-served in the component mounting machine, among empty slots in the supply target attachment section of the target feeder and empty slots in the buffer target attachment section, the management device pre-serves the target feeder in a serving destination in which the empty slots in the buffer target attachment section are prioritized. In this way, it is possible to secure empty slots in the supply target attachment section while pre-serving the feeder in the component mounting machine. Therefore, even when a feeder having a higher priority than that of the target feeder needs to be served in the supply target attachment section after the target feeder is pre-served, it is not necessary to detach the attached feeder. Therefore, it is possible to more efficiently perform the serving of the feeder by avoiding wasteful detachment work of the feeder.

BRIEF DESCRIPTION OF DRAWINGS

FIG. 6 is an explanatory diagram illustrating an example of feeder holding information.

FIG. 7 is an explanatory diagram illustrating an example of component arrangement information.

FIG. 8 is a flowchart illustrating an example of a loader work instruction routine.

DESCRIPTION OF EMBODIMENTS

Next, an embodiment of the present disclosure will be described while referring to accompanying drawings.

Figure 1:
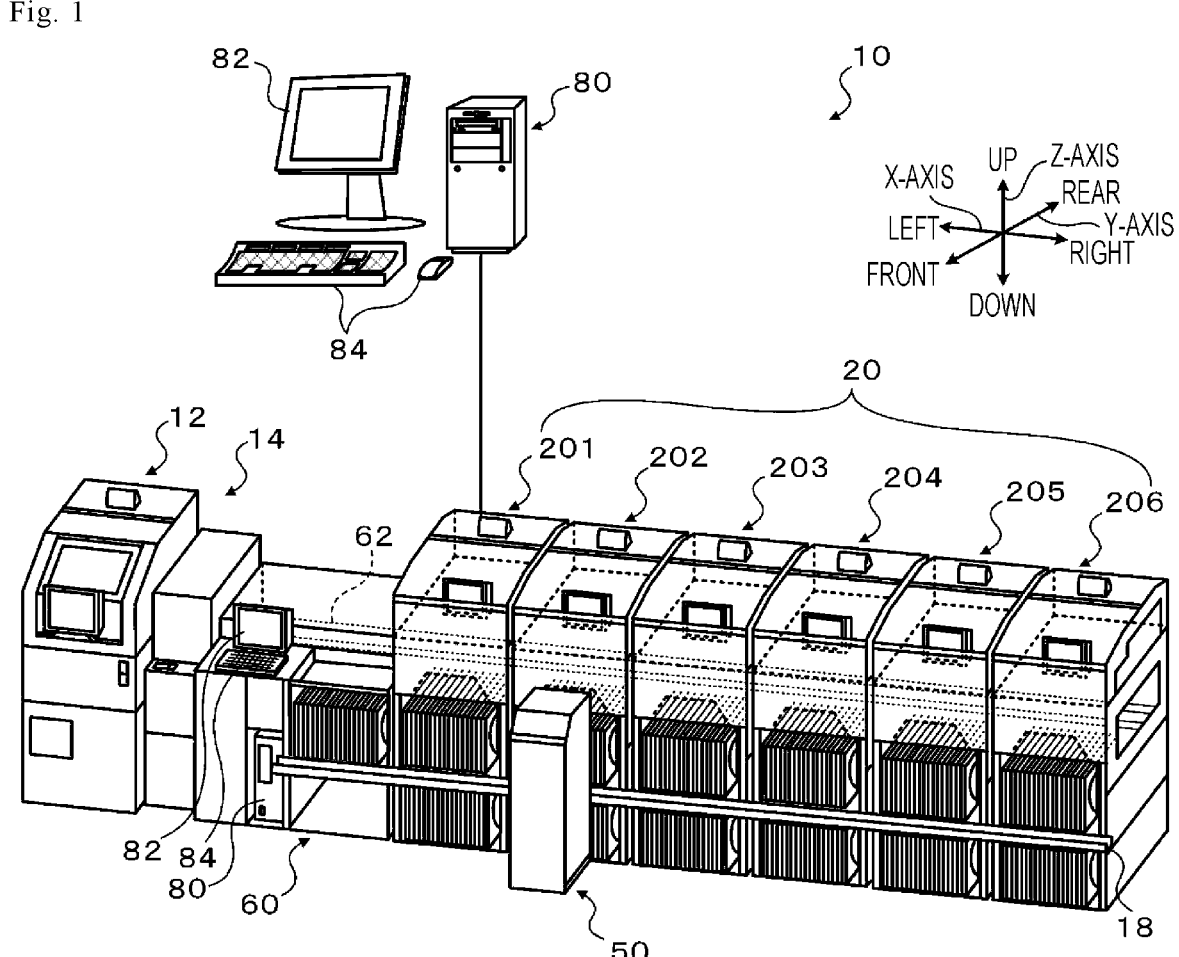
FIG. 1 is a schematic configuration view of a component mounting system.
Figure 2:
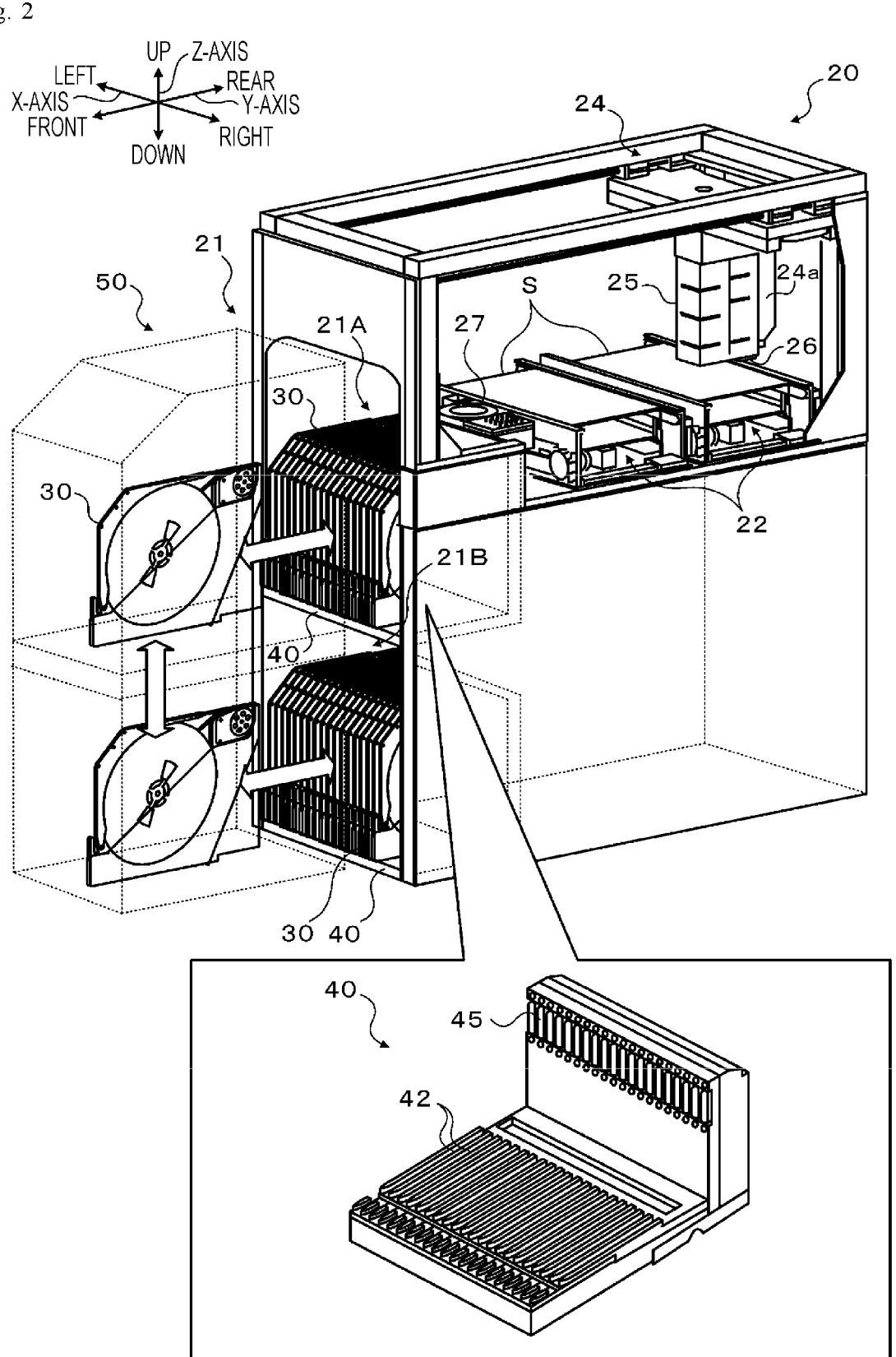
FIG. 2 is a schematic configuration view of a component mounting machine and a feeder.
Figure 3:
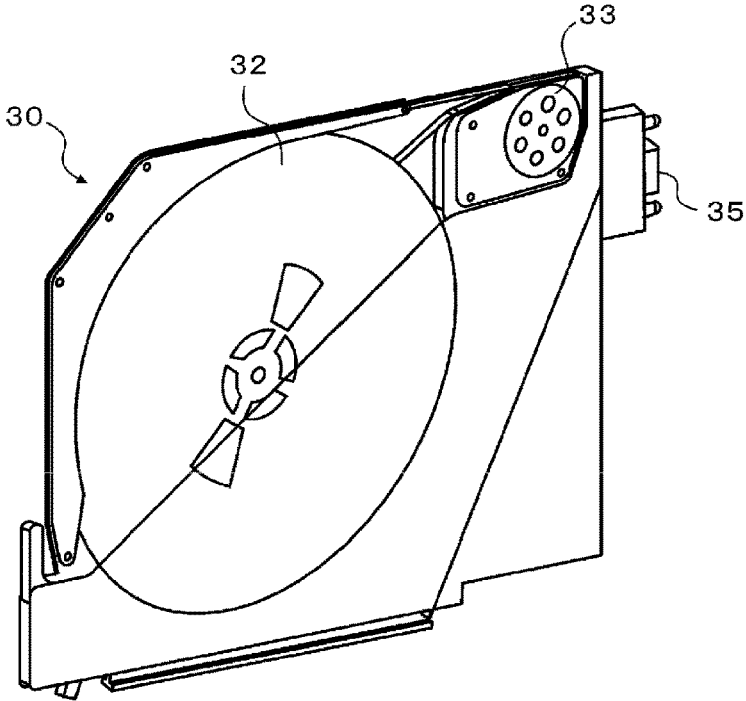
FIG. 3 is a schematic configuration view of the feeder.
Figure 4:
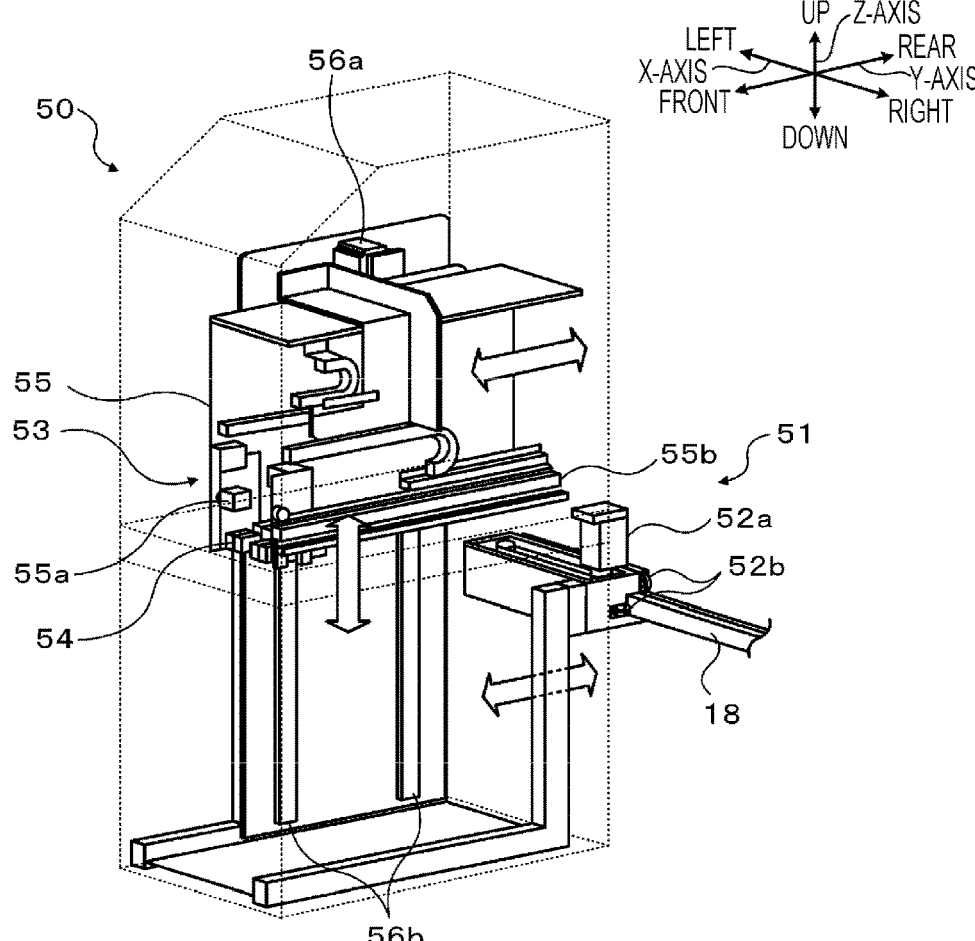
FIG. 4 is a schematic configuration view of a loader.
Figure 5:
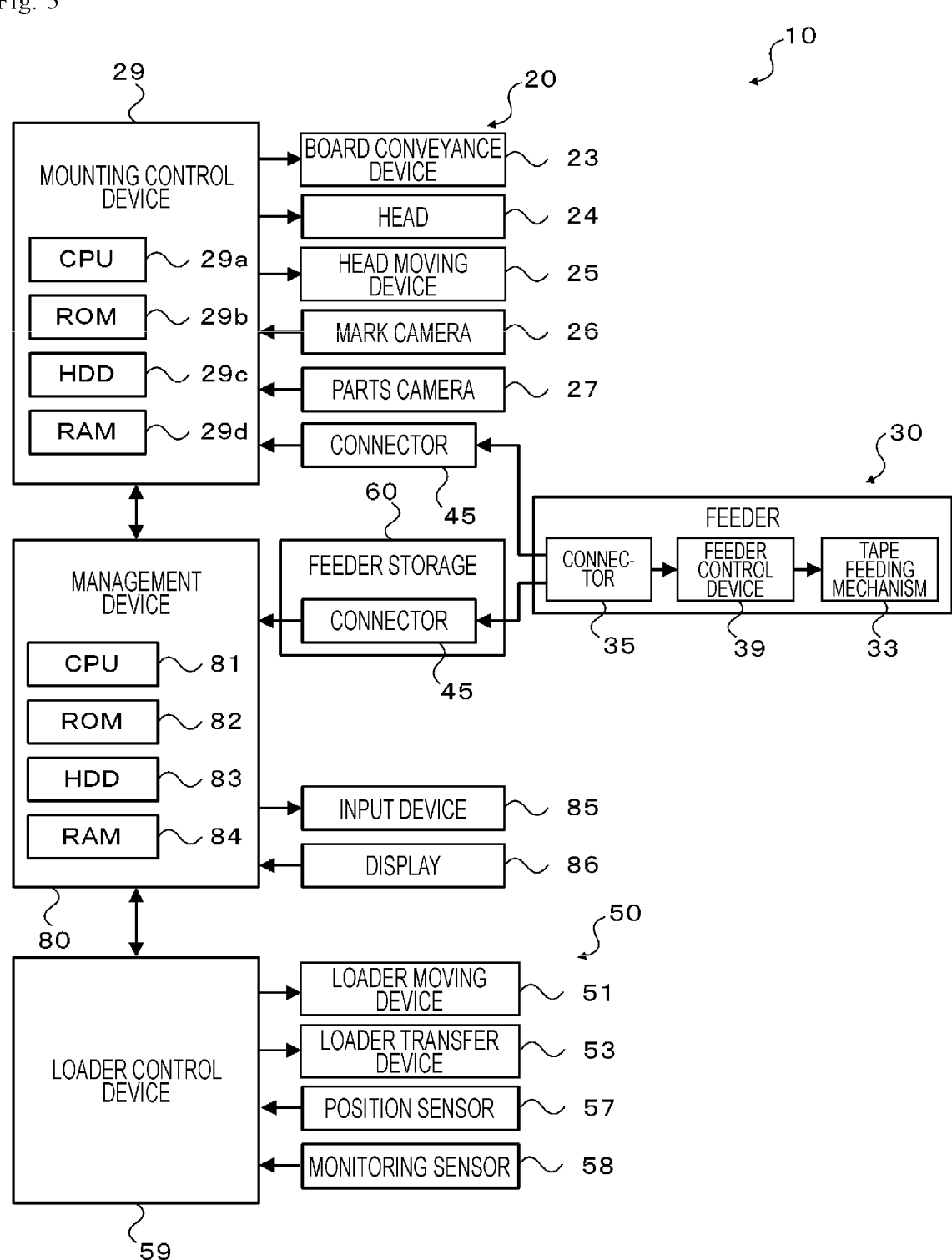
FIG. 5 is a block diagram illustrating electrical connection relationships of the component mounting system.

FIG. 1 is a schematic configuration view of a component mounting system. FIG. 2 is a schematic configuration view of a component mounting machine and a feeder base. FIG. 3 is a schematic configuration view of the feeder. FIG. 4 is a schematic configuration view of a loader. FIG. 5 is a block diagram illustrating electrical connection relationships of the component mounting system. In FIGS. 1, 2, and 4, a left-right direction is defined as an X-axis direction, a front-rear direction is defined as a Y-axis direction, and an up-down direction is defined as a Z-axis direction.

Component mounting system 10 produces a board on which a component is mounted on board S, and as illustrated in FIG. 1, includes printing device 12, print inspection device 14, multiple component mounting machines 20 (201 to 206), mount inspection device (not illustrated), loader 50, feeder storage 60, and management device 80 that manages the entire system. Printing device 12 prints solder on a front surface of board S. Print inspection device 14 inspects a state of the solder printed by printing device 12. Component mounting machine 20 picks up a component supplied from feeder 30 by a suction nozzle (pickup member) and mounts the component on board S. The mount inspection device inspects a mounting state of the component mounted by component mounting machine 20. Printing device 12, print inspection device 14, multiple component mounting machines 20, and the mount inspection device are arranged in this order from an upstream side along a conveyance direction of board S to constitute a production line.

As illustrated in FIG. 2, component mounting machine 20 includes attachment target section 21 to which feeder 30 is attached, board conveyance device 22 that conveys board S in the X-axis direction, head 25 that picks up a component from feeder 30 and mounts the same on board S, head moving device 24 that causes head 25 to move in a horizontal direction (XY-axis direction), and mounting control device 29 (refer to FIG. 5). Although not illustrated, head 25 includes a suction nozzle for picking up the component and a lifting and lowering device for lifting and lowering the suction nozzle. Head moving device 24 includes slider 24a to which head 25 is attached, and causes slider 24a to move in the horizontal direction (XY-axis direction).

As illustrated in FIG. 3, feeder 30 is a cassette type tape feeder and includes tape reel 32, tape feeding mechanism 33, connector 35, and feeder control device 39 (refer to FIG. 5). Tape reel 32 is wound with a tape in which components are accommodated. The components are protected by a film covering a surface of the tape. Tape feeding mechanism 33 pulls the tape from tape reel 32 and feeds the tape to a component supply position. As the film is peeled off directly before the component supply position, the component accommodated in the tape is in an exposed state at the component supply position to be picked up by head 25 (suction nozzle). Feeder control device 39 includes a well-known CPU, ROM, RAM, or the like, and outputs a drive signal to tape feeding mechanism 33 (feeding motor).

Attachment target section 21 is provided on a front surface side (front part) of component mounting machine 20, and has two upper and lower areas in which feeder 30 can be set. An upper area is supply area 21A in which feeder 30 can supply the component to a position where head 25 can pick up (component supply position), and a lower area is buffer area 21B for temporarily storing feeder 30. Feeder base 40 is installed in each of areas 21A and 21B. As illustrated in FIG. 2, feeder base 40 in each of areas 21A and 21B has multiple slots 42 having feeder 30 to and from which attached and detached, and multiple connectors 45 electrically connected to connectors 35 of feeder 30 attached to the corresponding slots 42. Feeder 30 accommodating components to be used in a running job (production) is attached in supply area 21A. In addition, in a case where there are empty slots 42 in supply area 21A, spare feeder 30 for supplying the same type of component in place of feeder 30 which is in component shortage during the production, feeders 30 accommodating components to be used in jobs to be executed from the next time, and the like are also attached. Buffer area 21B is used to temporarily store feeders 30 accommodating components to be used in jobs to be executed from the next time, or to temporarily store used feeder 30.

Component mounting machine 20 also includes mark camera 26, parts camera 27, and the like. Mark camera 26 captures a reference mark attached to board S from above in order to detect the position of board S. Parts camera 27 captures an image of a component picked up by the suction nozzle from below in order to detect a pickup error or a pickup deviation.

Mounting control device 29 includes well-known CPU 29a, ROM 29b, HDD 29c, RAM 29d, and the like. Mounting control device 29 inputs image signals such as from mark camera 26 and parts camera 27. In addition, mounting control device 29 outputs drive signals to board conveyance device 22, head 25, head moving device 24, and the like.

In addition, mounting control device 29 is communicably connected to feeder control device 39 of feeder 30 attached to feeder base 40 via connectors 35 and 45. When feeder 30 is attached, mounting control device 29 receives feeder information such as a feeder ID, a component type, and the number of remaining components included in feeder control device 39 of feeder 30 from feeder control device 39. In addition, mounting control device 29 transmits the received feeder information and the attachment position (slot number) where feeder 30 is attached to management device 80.

CPU 29a of mounting control device 29 executes mounting process for mounting a component on board S. CPU 29a causes head 25 to move above the component supply position of feeder 30 by head moving device 24. Subsequently, CPU 29a lowers the suction nozzle by the lifting and lowering device to pick up the component to the suction nozzle. CPU 29a causes the component picked up by the suction nozzle to move above parts camera 27 by head moving device 24, and captures the component by parts camera 27. CPU 29a processes the captured image of the component, measures an amount of pickup deviation of the component, and corrects the mounting position of the component on board S. Then, CPU 29a causes the component picked up by the nozzle to move above the mounting position after correction by head moving device 24, and lowers the suction nozzle by the lifting and lowering device to mount the component on board S.

Feeder storage 60 is a storing place that is incorporated in a production line and temporarily stores multiple feeders 30. In feeder storage 60, a feeder base provided with multiple slots 42 and multiple connectors 45 similar to feeder base 40 of component mounting machine 20 is installed. In feeder storage 60, feeder 30 which is in use plan is provided or used feeder 30 is collected by an automatic conveyance vehicle (AGV) or an operator (not illustrated). When feeder 30 is attached to connector 45 of feeder storage 60, feeder information such as a feeder ID, a component type, and the number of remaining components included in feeder 30, and the attachment position (slot number) where feeder 30 is attached are transmitted to management device 80.

As illustrated in FIG. 1, loader 50 moves onto the front surface of component mounting system 10 (production line) along the line to pick up feeder 30 which is in use plan from feeder storage 60 and provide the feeder to each component mounting machine 20, or to collect used feeder 30 from each component mounting machine 20 and carry the feeder to feeder storage 60. As illustrated in FIG. 4, loader 50 includes loader moving device 51, feeder transfer device 53, and loader control device 59 (refer to FIG. 5). Loader moving device 51 causes loader 50 to move along guide rail 18 arranged in the front surface of the production line. Loader moving device 51 includes X-axis motor 52a that drives a driving belt for moving loader 50, and guide roller 52b that rolls on guide rail 18 to guide the movement of loader 50. Feeder transfer device 53 transfers feeder 30 between component mounting machine 20 and loader 50 at a position where loader 50 faces any component mounting machine 20, or transfers feeder 30 between feeder storage 60 and loader 50 at a position where loader 50 faces feeder storage 60. Feeder transfer device 53 includes Y-axis slider 55 and Z-axis motor 56a that causes Y-axis slider 55 to move along Z-axis guide rail 56b. Y-axis slider 55 includes clamp section 54 that clamps feeder 30, and Y-axis motor 55a that causes clamp section 54 to move along Y-axis guide rail 55b. Y-axis slider 55 is lifted and lowered by the driving of Z-axis motor 56a. In feeder transfer device 53, by lifting Y-axis slider 55, Y-axis slider 55 faces feeder base 40 of supply area 21A of component mounting machine 20 and feeder base 40 of feeder storage 60, and feeder 30 is clamped by clamp section 54 and is caused to move in Y-axis direction by Y-axis slider 55 in this state, thereby transferring feeder 30 to supply area 21A and feeder storage 60. In feeder transfer device 53, by lowering Y-axis slider 55, Y-axis slider faces buffer area 21B of component mounting machine 20, and feeder 30 is clamped by clamp section 54 and is caused to move in Y-axis direction by Y-axis slider 55 in this state, thereby transferring feeder 30 to buffer area 21B. Loader control device 59 includes a well-known CPU, ROM, RAM, and the like, inputs signals from position sensor 57 for detecting a traveling position or monitoring sensor 58 for detecting the presence or absence of an obstacle in the vicinity, and outputs drive signals to loader moving device 51 and feeder transfer device 53.

Management device 80 is a general-purpose computer, and as illustrated in FIG. 5, includes CPU 81, ROM 82, HDD 83 (storage device), and RAM 84. Input device 85 such as a keyboard and a mouse, and display 86 are electrically connected to management device 80. In addition to the production schedule, HDD 83 stores feeder holding information, job information, status information, and the like as various information required for production. These pieces of information are managed for each component mounting machine 20. Here, the production schedule is a schedule that specifies which component is mounted on which board S in which order in each component mounting machine 20, how many boards S (products) mounted in that manner are manufactured, and the like. The feeder holding information is information as to feeder 30 held by each component mounting machine 20 and feeder storage 60. As illustrated in FIG. 6, the feeder holding information includes feeder information such as a feeder ID, a component type, and the number of remaining components, and position information such as a device (location) holding feeder 30 (component) and an attachment position (slot number) of feeder 30. The job information is information as to the mounting process (job) to be executed by each component mounting machine 20. The job information includes the type of board to be produced, the type of component to be mounted, a mounting position for each component, and an arrangement position (arrangement position information) of a component to be arranged in supply area 21A for each job.

The arrangement position information of the component indicates a predetermined attachment position (predetermined slot) of feeder 30 accommodating the component, and is managed for each component mounting machine 20. As illustrated in FIG. 7, the arrangement position information stores execution procedures of jobs and the type of component to be arranged for each slot 42 in supply area 21A in association with each other. The status information is information indicating the operation status of each component mounting machine 20. The status information includes during the production, during setup change, during abnormality occurrence, and the like.

Management device 80 is communicably connected to mounting control device 29 by wire, and exchanges various information with each component mounting machine 20 of component mounting system 10. Management device 80 receives the operation status from each component mounting machine 20 and updates the status information to the latest one. In addition, management device 80 is communicably connected to feeder control device 39 of feeder attached to feeder base 40 of each component mounting machine 20 via mounting control device 29. When feeder 30 is detached from component mounting machine 20 or feeder storage or is attached to component mounting machine 20 or feeder storage 60, management device receives the attachment and detachment status from the corresponding component mounting machine 20 or the corresponding feeder storage 60, and updates the feeder holding information to the latest information. In addition, management device 80 is communicably connected to loader control device 59 wirelessly, and exchanges various information with loader 50. In addition, management device 80 is also communicably connected to each control device of printing device 12, print inspection device 14, and the mount inspection device, and also exchanges various information from the corresponding devices.

Next, an operation of component mounting system 10 configured as described above will be described. In particular, an operation performed when components (feeders 30 accommodating the components) to be used in jobs to be executed from the next time are pre-served will be described. FIG. 8 is a flowchart illustrating an example of a loader work instruction routine executed by CPU 81 of management device 80. This routine is repeatedly executed every predetermined time period.

When the loader work instruction routine is executed, CPU 81 first refers to the feeder holding information illustrated in FIG. 6 to determine whether there are components (feeders 30 accommodating the components) to be used in jobs to be executed from the next time in feeder storage 60 (S100). When CPU 81 determines that there is no corresponding component, the process proceeds to S240. On the other hand, when it is determined that there are corresponding components, CPU 81 sets a serving target component to be the serving target for this time among the corresponding components (S110).

Next, CPU 81 determines whether the predetermined slot of the serving target component is empty (S120). The predetermined slot is an arrangement position (slot number) in supply area 21A where the component to be used in the job is to be arranged, and is determined in advance by the optimization program such that the execution of the job using the component is optimized. The determination in S120 is performed by reading out the predetermined slot of the serving target component from the component arrangement information illustrated in FIG. 7, and determining whether another component (feeder 30) is attached in the read predetermined slot based on the feeder holding information illustrated in FIG. 6. When it is determined that the predetermined slot of the serving target component is empty, CPU 81 sets the serving destination of the serving target component to the predetermined slot of the serving target component (S130).

When it is determined that the predetermined slot of the serving target component is not empty, CPU 81 determines whether there are empty slots in buffer area 21B of a target component mounting machine (host machine), which is component mounting machine 20 being the serving destination of the serving target component, based on the feeder holding information (S140). When it is determined that there are empty slots in buffer area 21B of the host machine, CPU 81 sets the serving destination of the serving target component to any empty slot in buffer area 21B of the host machine (S150). In a case where there are multiple empty slots in buffer area 21B of the host machine, CPU 81 may set the empty slot closest to the predetermined slot of the serving target component among the multiple empty slots to the serving destination.

When it is determined that there is no empty slot in buffer area 21B of the host machine, CPU 81 determines whether there are empty slots in the supply area 21A of the host machine based on the feeder holding information (S160). When it is determined that there are empty slots in supply area 21A of the host machine, CPU 81 sets the serving destination of the serving target component to any empty slot other than the predetermined slot described above in supply area 21A of the host machine (S170). In a case where there are multiple empty slots in supply area 21A of the host machine, CPU 81 may set the empty slot closest to the predetermined slot of the serving target component among the multiple empty slots to the serving destination.

When it is determined that there is no empty slot in supply area 21A of the host machine, CPU 81 determines whether there are empty slots in buffer area 21B of a non-target component mounting machine (the other machine), which is component mounting machine 20 not being the serving destination of the serving target component, based on the feeder holding information (S180). When it is determined that there are empty slots in buffer area 21B of the other machine, CPU 81 sets the serving destination of the serving target component to any empty slot in buffer area 21B closest to the host machine among buffer areas 21B of the other machines (S190). In a case where there are multiple empty slots in corresponding buffer area 21B, CPU 81 may set the empty slot closest to the predetermined slot of the serving target component among the multiple empty slots to the serving destination.

When it is determined that there is no empty slot in buffer area 21B of the other machine, CPU 81 determines whether there are empty slots in supply area 21A of the other machine based on the feeder holding information (S200). When it is determined that there are empty slots in supply area 21A of the other machine, CPU 81 sets the serving destination of the serving target component to any empty slot in supply area 21A closest to the host machine among supply areas 21A of the other machines (S210). In a case where there are multiple empty slots in corresponding supply area 21A, CPU 81 may set the empty slot closest to the predetermined slot of the serving target component among the multiple empty slots to the serving destination. On the other hand, when it is determined that there is no empty slot in supply area 21A of the other machine, CPU 81 proceeds the process to S240 without setting the serving destination of the serving target component.

When the serving destination of the serving target component is set in this manner, CPU 81 determines whether there are other components whose serving destination is undetermined among the components corresponding to S100 (S220). When it is determined that there are other components whose serving destination is undetermined, CPU 81 returns to S110 to set the serving target component for the next time among the corresponding components and repeat the processes of S110 to S210 which set the serving destination. On the other hand, when it is determined that there is no other component whose serving destination is undetermined, CPU 81 transmits a serving instruction to loader 50 such that each serving target component (feeder 30 accommodating each serving target component) is pre-served in each set serving destination (S230). Loader 50 that has received the serving instruction serves the serving target component (feeder 30 accommodating the serving target component) to the designated serving destination.

Next, CPU 81 determines whether there is a component that is pre-served in other slots other than the predetermined slot of the current component among the components arranged in supply area 21A and buffer area 21B of each component mounting machine 20 (S240). When it is determined that there is a component that is pre-served in other slots, CPU 81 determines whether a preceding job which uses another component of which a predetermined slot overlaps with the predetermined slot of the current component is ended (S250). When it is determined that there is no component that is pre-served in other slots other than the predetermined slot, or that the preceding job which uses a component of which a predetermined slot overlaps with the predetermined slot of the current component is not ended, CPU 81 ends the present routine.

On the other hand, when it is determined that there is a component that is pre-served in other slots other than the predetermined slot and the preceding job which uses the component of which the predetermined slot overlaps with the predetermined slot of the current component is ended, CPU 81 sets a moving destination of a moving target component to a predetermined slot of the moving target component using the corresponding component as the moving target component, designates the moving destination, transmits a serving instruction (movement instruction) to loader 50 (S260), and ends the present routine. Loader 50 that has received the movement instruction collects the used component (feeder 30) used in the preceding job from the predetermined slot, and serves the moving target component to the predetermined slot. As described above, when the predetermined slot of the current component is not empty, the current component is pre-served in the empty slot other than the original predetermined slot. The process of S260 is a process for collecting the used component and moving the current component to the original predetermined slot in a case where the preceding job is ended and the component of which the predetermined slot overlaps with the predetermined slot of the current component is used. As described above, since the component not arranged in the original predetermined slot is served to the slot as close as possible to the predetermined slot, when the component is caused to move, an amount of movement can be reduced. As a result, loader 50 can quickly perform moving work of the component.

Figure 9:
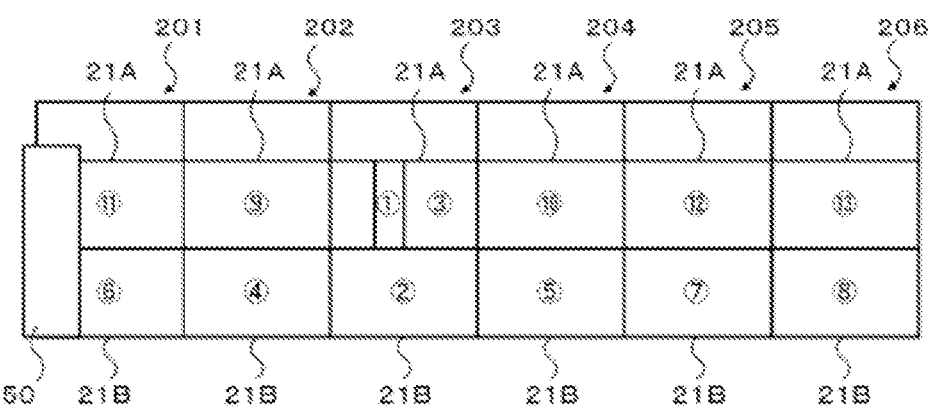
FIG. 9 is an explanatory diagram illustrating a priority order of a pre-serving location of a component (feeder).

FIG. 9 is an explanatory diagram illustrating a priority order of a pre-serving location of a component (feeder). In the FIG. 9, among the six component mounting machines 201 to 206, component mounting machine 203 indicates a target component mounting machine (host machine), and component mounting machines 201,202,204 to 206 indicate non-target component mounting machines (the other machines). The pre-serving of the serving target component is performed by examining the empty slots in order from the highest priority in accordance with a predetermined priority order, and determining the found empty slot as the serving destination. As illustrated in the FIG. 9, the priority order is determined, from the highest priority, in the order of the predetermined slot of the serving target component, buffer area 21B of the host machine, supply area 21A other than the predetermined slot of the host machine, buffer areas 21B of the other machines, and supply areas 21A of the other machines. In buffer areas 21B of the other machines, a higher priority is determined for the one as being closer to the host machine. In supply areas 21A of the other machines, a higher priority is determined for the one as being closer to the host machine. Thereby, the serving target component is pre-served in the predetermined slot when the predetermined slot is empty. In addition, when the predetermined slot is not empty, the serving target component is pre-served in the empty slot in buffer area 21B of the host machine. Further, when buffer area 21B of the host machine is not empty, the serving target component is pre-served in the empty slot other than the predetermined slot in supply area 21A of the host machine. In addition, when supply area 21 of the host machine is not empty, the serving target component is pre-served in the empty slot in buffer area 21B of the other machine as close as possible to the host machine. Further, when buffer area 21B in any other machine is not empty, the serving target component is pre-served in the empty slot in supply area 21A of the other machine as close as possible to the host machine.

Here, in the present embodiment, when the component shortage is predicted while the job is being executed using the component arranged in supply area 21A, spare feeder 30 accommodating the same type of component is arranged in the empty slot in supply area 21A. As a result, component mounting machine 20 can avoid suspension of the job by picking up the component from spare feeder 30 even when the component shortage occurs in some feeders 30 during execution of the job. However, when a large number of components to be used from the next time are arranged in supply area 21A, there may be a case where there is no empty slot in supply area 21A when spare feeder 30 is served. In this case, loader 50 once detaches feeder 30 that is not used in the current job that occupies supply area 21A, and then needs to attach spare feeder 30 that is used in the current job to empty slot 42, resulting in wasteful detachment work. In the present embodiment, in a case where components (serving target components) to be used in jobs from the next time are pre-served, the serving destination of the serving target component is set among supply area 21A and buffer area 21B of the host machine by giving priority to buffer area 21B. As a result, empty slots can be secured in supply area 21A of the host machine. Therefore, even when feeder 30 having a high priority needs to be served in supply area 21A later, the time required for serving work of feeder 30 can be shortened, and the serving of feeder 30 can be performed efficiently.

Here, a correspondence between principal elements of the present embodiment and principal elements disclosed in the columns of the claims will be described. That is, multiple slots 42 in supply area 21A of the present embodiment correspond to the multiple slots of the present disclosure, component mounting machine 20 corresponds to the component mounting machine, loader 50 corresponds to the work device, and CPU 81 that executes the loader work instruction routine corresponds to the management control section. Buffer area 21B corresponds to a buffer.

As a matter of course, the present disclosure is not limited to the above-described embodiment in any way, and can be embodied in various aspects without departing from the technical scope of the present disclosure.

For example, in the above-described embodiment, in a case where the serving target component is pre-served, CPU 81 pre-serve the serving target component in supply area 21A or buffer area 21B of the other machine in a case where there is no empty slot in either supply area 21A or buffer area 21B of the host machine. However, in a case where there is no empty slot in either supply area 21A or buffer area 21B of the host machine, CPU 81 need not pre-serve the serving target component.

As described above, the management device of the present disclosure is a management device for use in a component mounting system including a component mounting machine that includes a supply target attachment section having multiple slots to which a feeder is attached, a buffer target attachment section having multiple slots to which the feeder is attached, and a mounting section that executes a mounting job of picking up and mounting a component supplied from a feeder attached in a slot in the supply target attachment section, and a work device configured to perform serving work and collecting work of the feeder for each slot in the supply target attachment section and each slot in the buffer target attachment section, the management device including a management control section configured to, in a case where a target feeder to be used in a target job to be executed from the next time is pre-served in the component mounting machine, determine a serving destination among empty slots in the supply target attachment section and empty slots in the buffer target attachment section by giving priority to the empty slots in the buffer target attachment section, and cause the work device to pre-serve the target feeder in the determined serving destination.

In the management device of the present disclosure, it is possible to secure empty slots in the supply target attachment section while pre-serving the feeder in the component mounting machine. Therefore, even when a feeder having a higher priority than that of the target feeder needs to be served in the supply target attachment section after the target feeder is pre-served, it is not necessary to detach the attached feeder. Therefore, it is possible to more efficiently perform the serving of the feeder by avoiding wasteful detachment work of the feeder.

In the management device of the present disclosure, the management control section may cause the work device to pre-serve the target feeder in the predetermined slot of the target feeder when the predetermined slot which is a predetermined serving destination of the target feeder is empty. By pre-serving the target feeder in the predetermined slot, it is possible to eliminate the need to cause the target feeder to move when executing the job which uses the target feeder.

Further, in the management device of the present disclosure, the component mounting system may include a mounting line on which multiple component mounting machines are arranged, the work device may be configured to perform the serving work and the collecting work of the feeder for each component mounting machine on the mounting line, and the management control section may be configured to, in a case of pre-serving the target feeder, when there is no empty slot in either the supply target attachment section or the buffer target attachment section of a target component mounting machine which is a component mounting machine that executes the target job, determine a serving destination to the supply target attachment section or the buffer target attachment section of another component mounting machine that is different from the target component mounting machine among the multiple component mounting machines constituting the mounting line, and cause the work device to pre-serve the target feeder in the determined serving destination. As a result, even when there is no empty slot in either the supply target attachment section or the buffer target attachment section of the target component mounting machine, the target feeder can be pre-served. In this case, the management control section may be configured to, in a case of pre-serving the target feeder, when there is no empty slot in either the supply target attachment section or the buffer target attachment section of the target component mounting machine, determine a serving destination among empty slots in the supply target attachment section and empty slots in the buffer target attachment section of the other component mounting machine by giving priority to the empty slots in the buffer target attachment section. As a result it is possible to secure empty slots in the supply target attachment section of the other component mounting machine. Therefore, even when a feeder having a higher priority than that of the target feeder needs to be served in the supply target attachment section of the other component mounting machine after the target feeder is pre-served, it is not necessary to detach the attached feeder. Therefore, it is possible to more efficiently perform the serving of the feeder by avoiding wasteful detachment work of the feeder. In these cases, the management control section may be configured to, in a case of pre-serving the target feeder, when there is no empty slot in either the supply target attachment section or the buffer target attachment section of the target component mounting machine, determine a serving destination among the other component mounting machines by giving priority to a component mounting machine which is closer to the target component mounting machine. As a result, even when there is no empty slot in the target component mounting machine which uses the target feeder, the target feeder can be pre-served. In addition, since the amount of movement can be reduced when the pre-served target feeder is caused to move in the predetermined slot, the setup changing work can be performed in a shorter time.

The present disclosure is not limited to the form of a management device, but may be in the form of a management method or the form of a work device.

INDUSTRIAL APPLICABILITY

The present disclosure can be applied to a manufacturing industry of a component mounting system, a component mounting machine, a management device, or the like.

REFERENCE SIGNS LIST

10: component mounting system, 12: printing device, 14: print inspection device, 18: guide rail, 20, 201 to 206: component mounting machine, 21: attachment target section, 21A: supply area, 21B: buffer area, 22: board conveyance device, 24: head moving device, 24*a*: slider, 25: head, 26: mark camera, 27: parts camera, 29: mounting control device, 29*a*: CPU, 29*b*: ROM, 29*c*: HDD, 29*d*: RAM, 30: feeder, 32: tape reel, 33: tape feeding mechanism, 35: connector, 39: feeder control device, 40: feeder base, 42: slot, 45: connector, 50: loader, 51: loader moving device, 52*a*: X-axis motor, 52*b*: guide roller, 53: feeder transfer device, 54: clamp section, 55: Y-axis slider, 55*a*: Y-axis motor, 55*b*:

Y-axis guide rail, 56*a*: Z-axis motor, 56*b*: Z-axis guide rail, 57: position sensor, 58: monitoring sensor, 59: loader control device, 60: feeder storage, 80: management device, 81: CPU, 82: ROM, 83: HDD, 84: RAM, 85: input device, 86: display

The invention claimed is:

1. A management device for use in a component mounting system including a mounting line on which component mounting machines are arranged each of the component mounting machines including a supply target attachment section having multiple slots to which a feeder is attached, a buffer target attachment section having multiple slots to which the feeder is attached, and a mounting head configured to execute a mounting job of picking up and mounting a component supplied from a feeder attached in a slot in the supply target attachment section, and a work device configured to perform serving work and collecting work of the feeder for each of the component mounting machines on the mounting line including each slot in the supply target attachment section and each slot in the buffer target attachment section, the management device comprising:

a management control section configured to in a case where a target feeder to be used in a target job to be executed from a next time is pre-served in a target component mounting machine of the component mounting machines configured to execute the target job, determine a serving destination among empty slots in the supply target attachment section and empty slots in the buffer target attachment section of the target component mounting machine by giving priority to the empty slots in the buffer target attachment section, and cause the work device to pre-serve the target feeder in the determined serving destination of the target component mounting machine, and when there is no empty slot in either the supply target attachment section or the buffer target attachment section of the target component mounting machine, determine the serving destination to the supply target attachment section or the buffer target attachment section of an other component mounting machine that is different from the target component mounting machine among the component mounting machines, and cause the work device to pre-serve the target feeder in the determined serving destination of the other component mounting machine.

2. The management device according to claim 1, wherein the management control section is configured to, in a case where a predetermined slot that is a predetermined serving destination of the target feeder is empty, cause the work device to pre-serve the target feeder in the predetermined slot of the target feeder.

3. The management device according to claim 1, wherein the management control section is configured to, in a case of pre-serving the target feeder, when there is no empty slot in either the supply target attachment section or the buffer target attachment section of the target component mounting machine, determine the serving destination among empty slots in the supply target attachment section and empty slots in the buffer target attachment section of the other component mounting machine by giving priority to the empty slots in the buffer target attachment section.

4. The management device according to claim 1, wherein the management control section is configured to, in a case of pre-serving the target feeder, when there is no empty slot in either the supply target attachment section or the buffer target attachment section of the target component mounting machine, determine the serving destination among the other component mounting machines by giving priority to a component mounting machine of the component mounting machines that is closer to the target component mounting machine.

5. A management method for use in a component mounting system including a mounting line on which component mounting machines are arranged each of the component mounting machines including a supply target attachment section having multiple slots to which a feeder is attached, a buffer target attachment section having multiple slots to which the feeder is attached, and a mounting head configured to execute a mounting job of picking up and mounting a component supplied from a feeder attached in a slot in the supply target attachment section, and a work device configured to perform serving work and collecting work of the feeder for each of the component mounting machines on the mounting line including each slot in the supply target attachment section and each slot in the buffer target attachment section, the method comprising:

determining, in a case where a target feeder to be used in a target job to be executed from a next time is pre-served in a target component mounting machine of the component mounting machines configured to execute the target job, a serving destination among empty slots of the target feeder in the supply target attachment section and empty slots in the buffer target attachment section of the target component mounting machine by giving priority to the empty slots in the buffer target attachment section, and causing the work device to pre-serve the target feeder in the determined serving destination of the target component mounting machine; and when there is no empty slot in either the supply target attachment section or the buffer target attachment section of the target component mounting machine, determining the serving destination to the supply target attachment section or the buffer target attachment section of an other component mounting machine that is different from the target component mounting machine among the component mounting machines, and cause the work device to pre-serve the target feeder in the determined serving destination of the other component mounting machine.

6. A work device for use in a component mounting system including a mounting line on which component mounting machines are arranged each of the component mounting machines including a supply target attachment section having multiple slots to which a feeder is attached, a buffer target attachment section having multiple slots to which the feeder is attached, and a mounting head configured to execute a mounting job of picking up and mounting a component supplied from a feeder attached in a slot in the supply target attachment section, and configured to perform serving work and collecting work of the feeder for each of the component mounting machines on the mounting line including each slot in the supply target attachment section and each slot in the buffer target attachment section, wherein, in a case where a target feeder to be used in a target job to be executed from a next time is pre-served in a target component mounting machine of the component mounting machines configured to execute the target job, among empty slots in the supply target attachment section and empty slots in the buffer target attachment section of the target component mounting machine, the work device pre-serves the target feeder in a serving destination in which the empty slots in the buffer target attachment section of the target component mounting machine are prioritized, and when there is no empty slot in either the supply target attachment section or the buffer target attachment section of the target component mounting machine, determine the serving destination to the supply target attachment section or the buffer target attachment section of an other component mounting machine that is different from the target component mounting machine among the component mounting machines, and cause the work device to pre-serve the target feeder in the determined serving destination of the other component mounting machine.

* * * * *